(12) United States Patent
Tsai et al.

(10) Patent No.: US 11,540,394 B2
(45) Date of Patent: Dec. 27, 2022

(54) OPTICAL TRANSCEIVER

(71) Applicant: Prime World International Holdings Ltd., New Taipei (TW)

(72) Inventors: Cheng-Ta Tsai, New Taipei (TW); Shih-Chin Yang, New Taipei (TW); Che-Shou Yeh, New Taipei (TW)

(73) Assignee: Prime World International Holdings Ltd., New Taipei (TW)

( * ) Notice: Subject to any disclaimer, the term of this patent is extended or adjusted under 35 U.S.C. 154(b) by 200 days.

(21) Appl. No.: 17/069,442

(22) Filed: Oct. 13, 2020

(65) Prior Publication Data

US 2022/0117088 A1 Apr. 14, 2022

(51) Int. Cl.

| H05K 1/14 | (2006.01) |
|---|---|
| H05K 7/14 | (2006.01) |
| H05K 1/18 | (2006.01) |
| H04B 10/40 | (2013.01) |
| H05K 1/02 | (2006.01) |

(52) U.S. Cl.
CPC ............ *H05K 1/144* (2013.01); *H04B 10/40* (2013.01); *H05K 1/0203* (2013.01); *H05K 1/181* (2013.01); *H05K 7/1427* (2013.01); *H05K 2201/041* (2013.01); *H05K 2201/10121* (2013.01); *H05K 2201/10189* (2013.01)

(58) Field of Classification Search
CPC ...... H05K 1/144; H05K 1/0203; H05K 1/181; H05K 7/1427; H05K 2201/041; H05K 2201/10121; H05K 2201/10189; H05K 1/0243; H05K 3/368; H05K 2203/049; H05K 1/141; H04B 10/40
USPC .......................................................... 398/117
See application file for complete search history.

(56) References Cited

U.S. PATENT DOCUMENTS

| 2013/0148977 A1* | 6/2013 | Shah ...................... H04B 10/40 398/135 |
|---|---|---|
| 2016/0223755 A1* | 8/2016 | Leigh ................... H01R 13/629 |
| 2019/0254165 A1* | 8/2019 | Wang ..................... H05K 1/028 |
| 2020/0295836 A1* | 9/2020 | Ishii .................... H04B 10/2581 |
| 2020/0333539 A1* | 10/2020 | Matsui ................. G02B 6/4249 |

\* cited by examiner

*Primary Examiner* — Don N Vo
(74) *Attorney, Agent, or Firm* — Grossman Tucker Perreault & Pfleger, PLLC

(57) ABSTRACT

An optical transceiver includes a housing, a mother board, an optical communication module and a daughter board. The mother board is accommodated in the housing. The optical communication module is disposed on a top surface of the mother board, and the optical communication module includes a first electrical interface. The daughter board is disposed on the top surface of the mother board, and the daughter board includes a second electrical interface electrically connected with the first electrical interface. The optical communication module is disposed on a flat region of the top surface of the mother board.

10 Claims, 6 Drawing Sheets

OPTICAL TRANSCEIVER

BACKGROUND

Technical Field

The present disclosure relates to optical communication, more particularly to an optical transceiver.

Related Art

Optical transceivers are generally installed in electronic communication facilities in modern high-speed communication networks. In order to make flexible the design of an electronic communication facility and less burdensome the maintenance of the same, an optical transceiver is inserted into a corresponding cage that is disposed in the communication facility in a pluggable manner. In order to define the electrical-to-mechanical interface of the optical transceiver and the corresponding cage, different form factors such as XFP (10 Gigabit Small Form Factor Pluggable) used in 10 GB/s communication rate, QSFP (Quad Small Form-factor Pluggable), or others at different communication rates have been made available.

As to the optical components in a conventional optical transceiver, a circuit board is disposed in a housing, and a TOSA (Transmitter optical sub-assembly) as well as a ROSA (Receiver optical sub-assembly) are mounted on the circuit board.

SUMMARY

According to one aspect of the present disclosure, an optical transceiver includes a housing, a mother board, an optical communication module and a daughter board. The mother board is accommodated in the housing. The optical communication module is disposed on a top surface of the mother board, and the optical communication module includes a first electrical interface. The daughter board is disposed on the top surface of the mother board, and the daughter board includes a second electrical interface electrically connected with the first electrical interface. The optical communication module is disposed on a flat region of the top surface of the mother board.

BRIEF DESCRIPTION OF THE DRAWINGS

The present disclosure will become more fully understood from the detailed description given below and the accompanying drawings which are given by way of illustration only and thus are not intending to limit the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
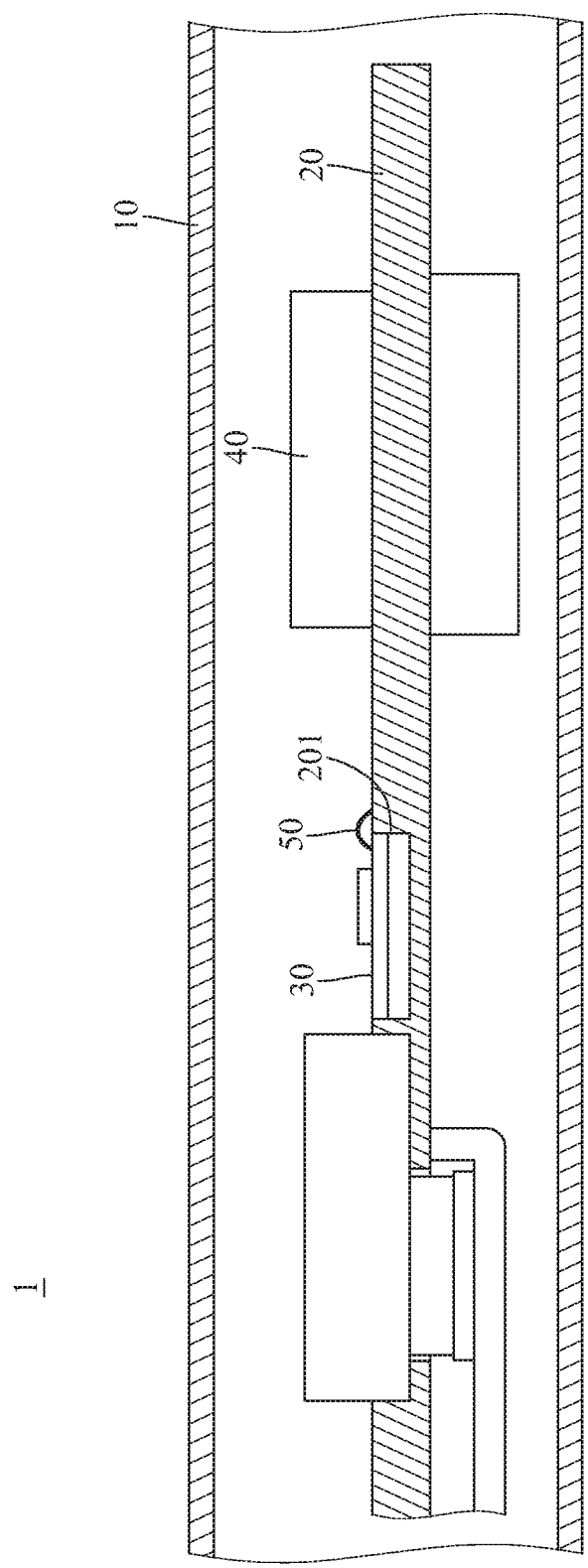
FIG. 1 is a side view of an optical transceiver according to one embodiment of the present disclosure.

Please refer to FIG. 1, which is a side view of an optical transceiver according to one embodiment of the present disclosure. An optical transceiver 1 may include a housing 10, a circuit board 20 and an optical sub-assembly 30. The circuit board 20 and the optical sub-assembly 30 are accommodated in the housing 10. The housing 10 may be configured to be inserted into a cage in pluggable manner. The circuit board 20 may be a high-frequency and high-speed multilayer PCB (Printed circuit board) including a recess 201 formed on a top surface of the circuit board 20. The optical sub-assembly 30 may be a TOSA or a ROSA disposed on the circuit board 20.

In order to meet the demand of the high speed communication and comply with the specification of form factors smaller in size, multilayer PCB is provided in the housing 10. An electrical signal path from the optical sub-assembly 30 to a signal processor 40 mounted on the circuit board 20 is among the factors of determining the performance of the optical transceivers (for example, signal latency and insertion loss of RF signals). As to the optical transceiver 1, the optical sub-assembly 30 is disposed in the recess 201 so that the optical sub-assembly 30 could be positioned at a favorable location to shorten the electrical signal path with an electrical interface of the optical sub-assembly 30 closer to an electrical interface of the circuit board 20. The two electrical interfaces can be connected with each other by wire bonding 50. However, since a part of the circuit board 20 is removed when the recess 201 is formed, certain electrical signals traveling in the circuit board 20 have to pass through longer traces.

Figure 2:
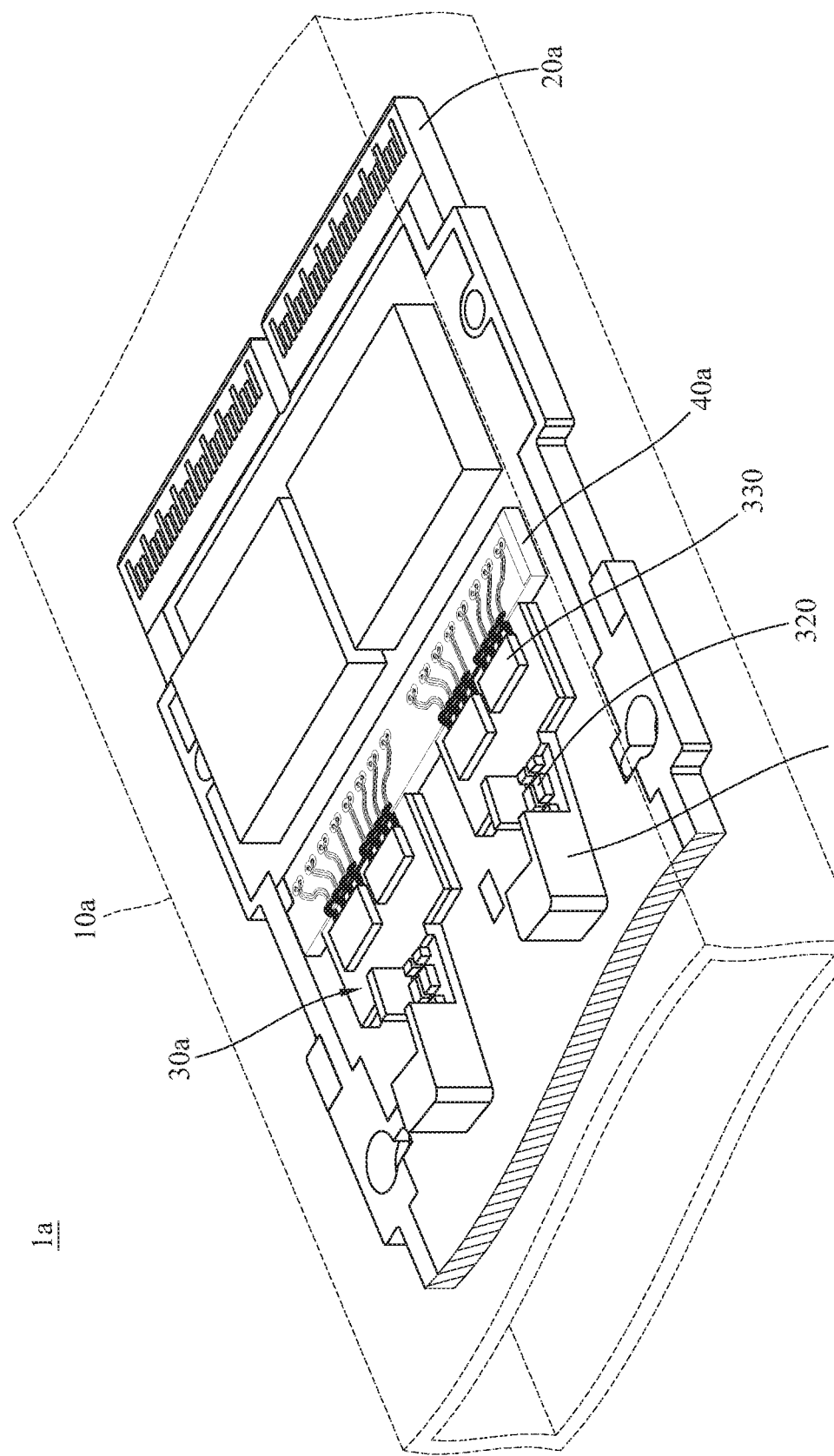
FIG. 2 is a schematic view of an optical transceiver according to another embodiment of the present disclosure.
Figure 3:
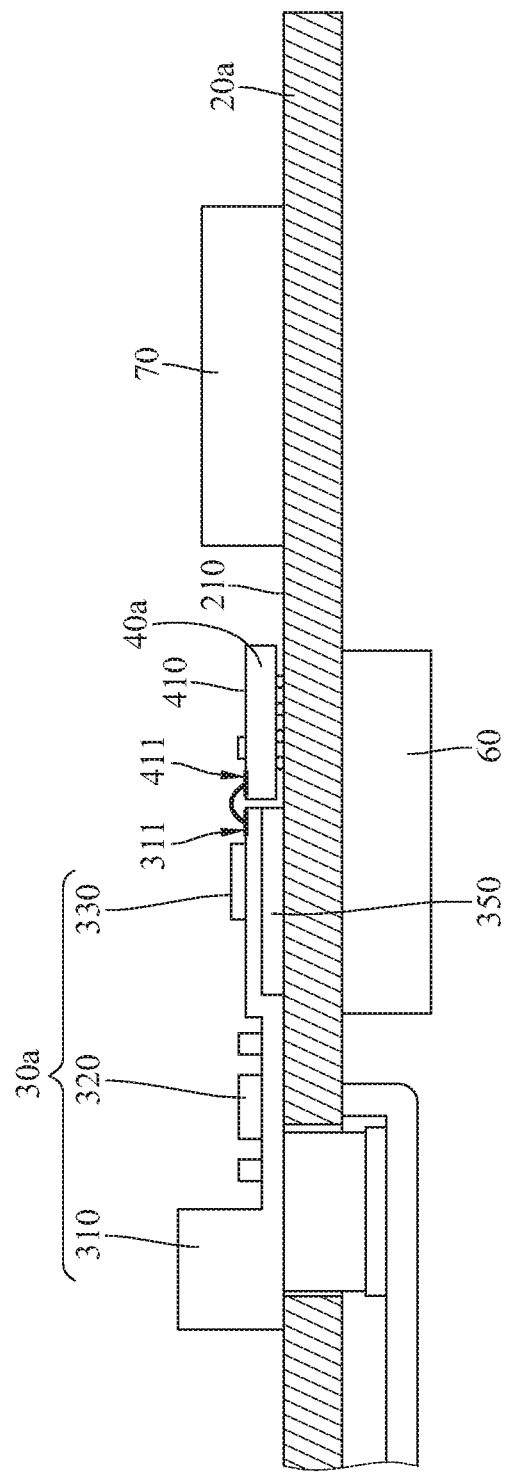
FIG. 3 is a side view of the optical transceiver in FIG. 2.
Figure 4:
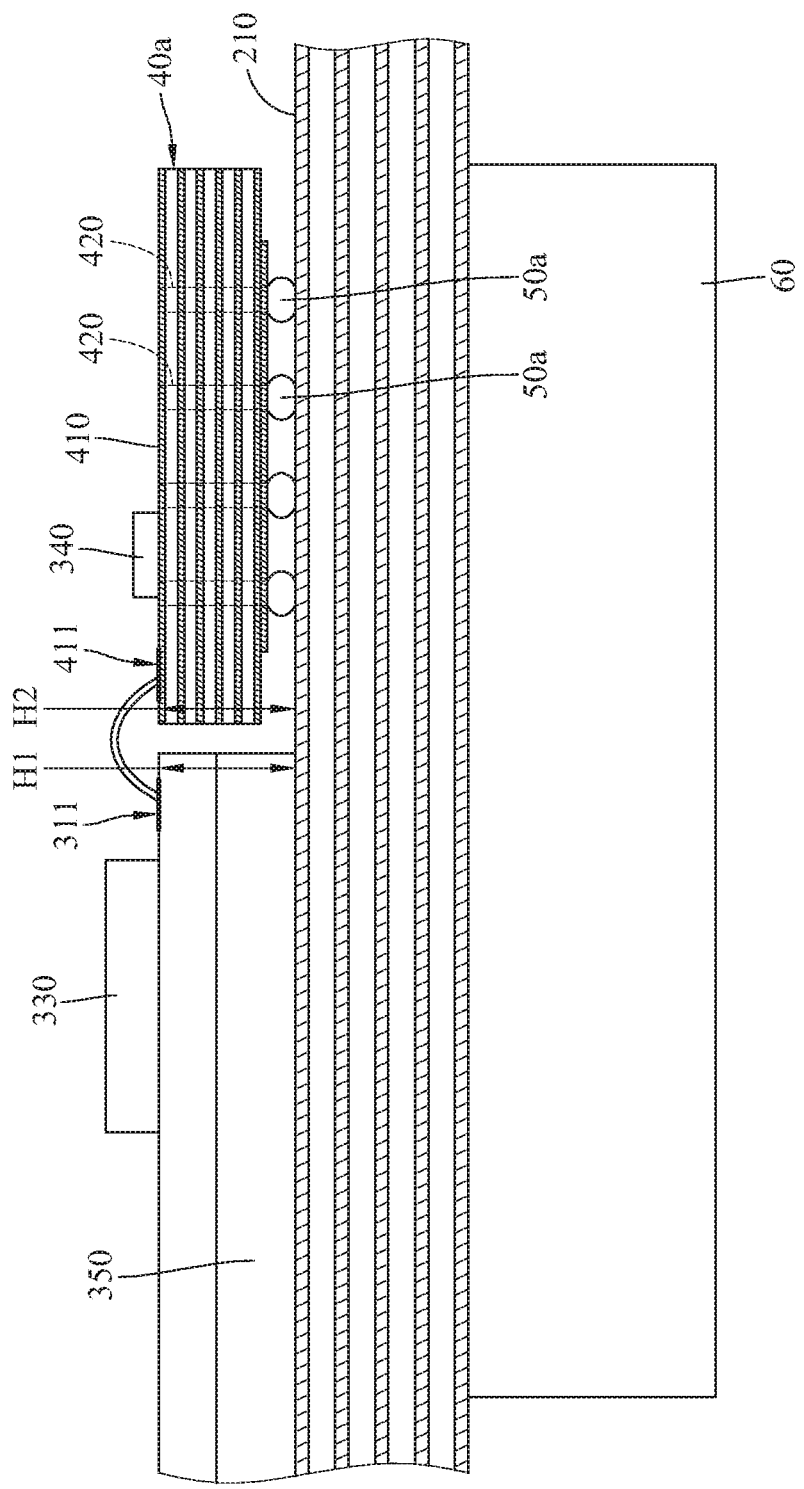
FIG. 4 is an enlarged view of the optical transceiver in FIG. 3.

The present disclosure discloses an improvement of optical transceiver to meet the requirements of shortened signal trace and reduced insertion loss. Please refer to FIG. 2 through FIG. 4. FIG. 2 is a schematic view of an optical transceiver according to another embodiment of the present disclosure, FIG. 3 is a side view of the optical transceiver in FIG. 2, and FIG. 4 is an enlarged view of the optical transceiver in FIG. 3. In this embodiment, an optical transceiver 1a may include a housing 10a, a mother board 20a, an optical communication module 30a, and a daughter board 40a.

The housing 10a may include an upper portion and a lower portion which are assembled together. The housing 10a may be configured to be inserted into a cage in pluggable manner. The mother board 20a, for example but not limited to, is a multilayer PCB accommodated in the housing 10a. For the purpose of illustration, the housing 10a is omitted in FIG. 3 and FIG. 4.

The optical communication module 30a, for example, is a TOSA or ROSA accommodated in the housing 10a. The optical communication module 30a includes a base 310, an active component 320, and a chip 330. The base 310 is disposed on the top surface 210 of the mother board 20a. The active component 320 and the chip 330 are disposed on the base 310, and the active component 320 is electrically connected with the chip 330. The active component 320 may be a laser diode as the optical communication module 30a is TOSA or a photodiode as the optical communication module 30a is ROSA. The base 310 includes a first electrical interface 311. The chip 330 may be a system-in-package (SIP) disposed on the top surface 210 and electrically connected with the first electrical interface 311.

In this embodiment, the mother board 20a is provided with its top surface 210 having a flat region where no recess or hole is formed, and the optical communication module 30a is disposed on a flat region of the top surface 210 of the mother board 20a.

The daughter board 40a, for example, is a multilayer PCB disposed on the top surface 210 of the mother board 20a, and a top surface 410 of the daughter board 40a includes a second electrical interface 411 electrically connected with the first electrical interface 311. Specifically, the second electrical interface 411 is connected with the first electrical interface 311 by wire bonding.

As shown in FIG. 3 and FIG. 4, the daughter board 40a includes one or more conductive vias 420, and one or more solder components 50a are disposed between the mother board 20a and the daughter board 40a. The second electrical interface 411 is electrically connected with the conductive via 420, and the conductive via 420 is electrically connected with the solder component 50a, thereby establishing an electrical signal path between the mother board 20a and the daughter board 40a. The solder component 50a, for example, is solder ball or solder paste.

The optical communication module 30a may include an optical component or an electrical component disposed on the top surface 410 of the daughter board 40a. In one embodiment, a component 340 may be an optical component, such as lens element or fiber array, is disposed on the top surface 410. In another embodiment, the component 340 may be an electrical component, such as resistors, capacitors, and/or inductors, is disposed on the top surface 410.

In this embodiment, the optical communication module 30a may include a heat dissipation structure 350 disposed on the top surface 210 of the mother board 20a. The heat dissipation structure 350, for example, is a copper plate having high thermal conductivity. A part of the base 310 of the optical communication module 30a is disposed on the heat dissipation structure 350.

In this embodiment, the optical transceiver 1a may include an electrical connector 60 located below the mother board 20a. The electrical connector 60 might be connected to a power supply (not shown in the drawing), and an electrical interface on the bottom surface of the mother board 20a contacts the electrical connector 60. Moreover, the optical communication module 30a may include a digital signal processor (DSP) 70 disposed on the top surface 210 of the mother board 20a. In one implementation, the counterpart of the location where the electrical connector 60 is positioned might not overlap the counterpart of the location where the DSP 70 is positioned.

As shown in FIG. 4, a vertical distance H1 between the top surface 210 of the mother board 20a and the first electrical interface 311 is equal to or larger than a vertical distance H2 between the first electrical interface 311 and the second electrical interface 411. The optical communication module 30a is not disposed in a recess of the mother board 20a to shorten the signal trace. Rather, a daughter board 40a is provided on the mother board 20a, and the component 340 (either optical component or electrical component) is disposed on the top surface of the daughter board 40a so as to shorten the signal trace between the optical communication module 30a and the daughter board 40a, which in turn would result in better telecommunication performance.

Figure 5:
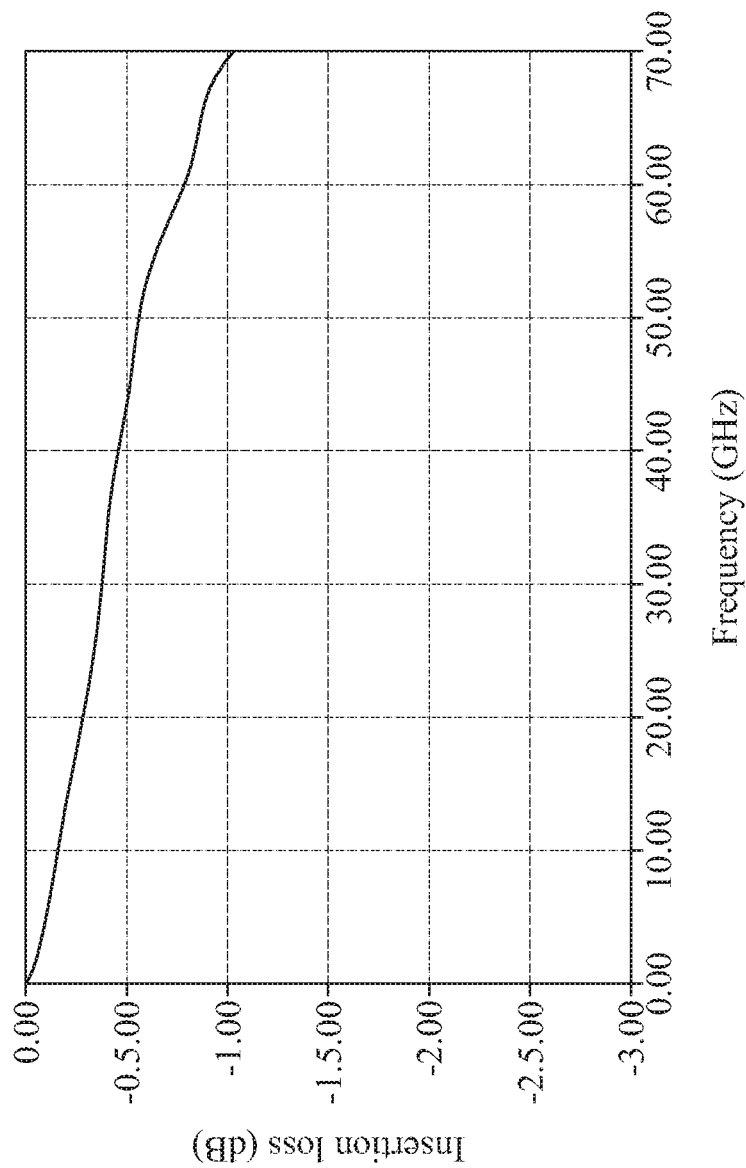
FIG. 5 is a graph showing insertion loss of the optical transceiver according to one embodiment of the present disclosure.
Figure 6:
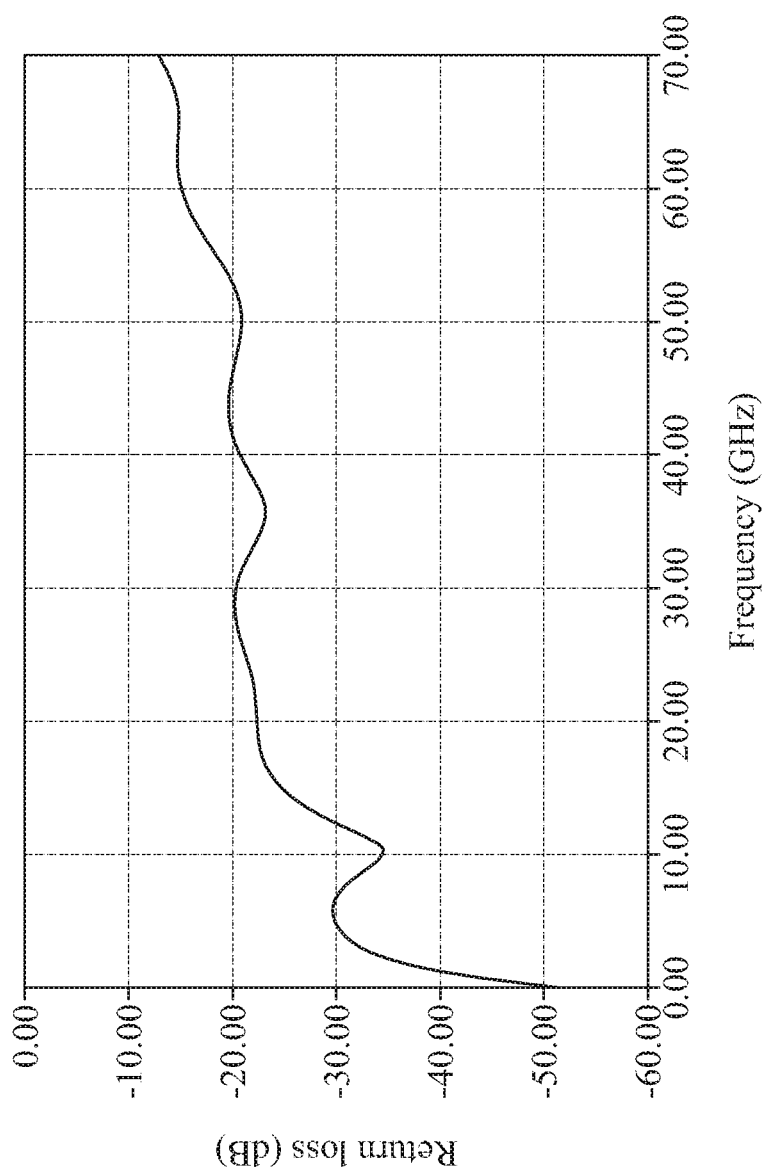
FIG. 6 is a graph showing return loss of the optical transceiver according to one embodiment of the present disclosure.

FIG. 5 is a graph showing insertion loss of the optical transceiver according to one embodiment of the present disclosure. FIG. 6 is a graph showing return loss of the optical transceiver according to one embodiment of the present disclosure. FIG. 5 shows the reduced insertion loss when the electrical signal travels from the optical communication module 30a through the mother board 20a and the daughter board 40a to the DSP 70. More specifically, FIG. 5 shows an insertion loss less than 0.64 dB from 5 GHz up to 50 GHz. Besides, FIG. 6 shows a high return loss when electrical signal is returned by the mother board 20a. More specifically, FIG. 6 shows a return loss greater than 18.3 dB from 5 GHz up to 50 GHz.

According to the present disclosure, the optical communication module is disposed on the top surface of the mother board, and the region of the top surface, where the optical communication module is disposed, is flat without any recess or hole. Moreover, the daughter board disposed on the top surface of the mother board is electrically connected with the optical communication module. The present disclosure provides a shortened electrical signal path from the optical communication module to a signal processor mounted on the mother board, and is favorable for meeting the requirements of reduced insertion loss and high return loss.

The embodiments are chosen and described in order to best explain the principles of the present disclosure and its practical applications, to thereby enable others skilled in the art to best utilize the present disclosure and various embodiments with various modifications as are suited to the particular use being contemplated. It is intended that the scope of the present disclosure is defined by the following claims and their equivalents.

What is claimed is:

1. An optical transceiver, comprising:
    a housing;
    a mother board accommodated in the housing, comprising a top surface;
    an optical communication module disposed on a first area of the top surface of the mother board, and the optical communication module comprising a first electrical interface; and
    a daughter board disposed on a second area other than the first area of the top surface of the mother board, comprising a first surface and a second surface opposite to the first surface, wherein the first surface is soldered on the second area and the second surface comprises a second electrical interface electrically connected with the first electrical interface;
    wherein the first area is a flat region of the top surface of the mother board; and
    a first vertical distance between the top surface of the mother board and the first electrical interface is not less than a second vertical distance between the first electrical interface and the second electrical interface.

2. The optical transceiver according to claim 1, wherein the second electrical interface is electrically connected with the first electrical interface by wire bonding.

3. The optical transceiver according to claim 1, wherein the optical communication module comprises a base and a chip, a top surface of the base comprises the first electrical interface, the chip is disposed on the top surface of the base, and the chip is electrically connected with the first electrical interface.

4. The optical transceiver according to claim 3, wherein the optical communication module further comprises a laser diode or a photodiode disposed on the base and electrically connected with the chip.

5. The optical transceiver according to claim 3, wherein the optical communication module further comprises a heat dissipation structure disposed on the top surface of the mother board.

6. The optical transceiver according to claim 1, wherein the optical communication module further comprises an optical component or an electrical component disposed on the second surface of the daughter board.

7. The optical transceiver according to claim 1, further comprising an electrical connector located below the mother board.

8. The optical transceiver according to claim 7, wherein the optical communication module further comprises a digital signal processor disposed on the top surface of the mother board, and a counterpart of location where the electrical connector is positioned does not overlap a counterpart of location where the digital signal processor is positioned.

9. The optical transceiver according to claim 1, further comprising a plurality of solder components disposed between the mother board and the daughter board.

10. The optical transceiver according to claim 1, wherein the second electrical interface is electrically connected with the mother board by at least one conductive via.

* * * * *